(12) United States Patent
Jin

(10) Patent No.: US 8,445,957 B2
(45) Date of Patent: May 21, 2013

(54) SEMICONDUCTOR DEVICE AND METHOD OF MANUFACTURING THE SAME

(75) Inventor: Ae Kyung Jin, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 16 days.

(21) Appl. No.: 12/972,404

(22) Filed: Dec. 17, 2010

(65) Prior Publication Data

US 2011/0248336 A1    Oct. 13, 2011

(30) Foreign Application Priority Data

Apr. 9, 2010   (KR) .................. 10-2010-0032726

(51) Int. Cl.
*H01L 29/78*    (2006.01)
*H01L 21/28*    (2006.01)

(52) U.S. Cl.
USPC  257/330; 438/586; 257/E21.19; 257/E29.262

(58) Field of Classification Search
USPC ............. 257/330, E21.19, E29.262; 438/586
See application file for complete search history.

(56) References Cited

U.S. PATENT DOCUMENTS

| 7,915,121 B1 * | 3/2011 | Kim ............................. 438/259 |
| 2005/0208725 A1 * | 9/2005 | Kim et al. ..................... 438/286 |

FOREIGN PATENT DOCUMENTS

| KR | 101998060646 | 10/1998 |
| KR | 1020050052027 A | 6/2005 |
| KR | 1020080090171 A | 10/2008 |
| KR | 1020090070965 A | 7/2009 |

* cited by examiner

*Primary Examiner* — Victor A Mandala
*Assistant Examiner* — Whitney T Moore

(57) ABSTRACT

A gate formed in a peripheral region is buried in a semiconductor device such that bit line contact plugs respectively coupled to an active region and the gate are simultaneously formed and a short-circuit between the gate and the bit line contact plug is prevented, thereby improving the characteristics of the device. The method of manufacturing the semiconductor device includes forming a gate buried in a semiconductor substrate, and forming a first bit line contact plug coupled to the gate and a second bit line contact plug coupled to the semiconductor substrate.

11 Claims, 4 Drawing Sheets

SEMICONDUCTOR DEVICE AND METHOD OF MANUFACTURING THE SAME

CROSS-REFERENCE TO RELATED APPLICATION

The present application claims priority to Korean patent application number 10-2010-0032726, filed on 9 Apr. 2010, which is incorporated by reference in its entirety.

BACKGROUND OF THE INVENTION

1. Field of the Invention

Embodiments of the present invention relate to a semiconductor device and a method of manufacturing the same, and more particularly to a bit line contact plug formed in a peripheral region during a process of manufacturing a semiconductor device.

2. Background of the Invention

A bit line contact plug formed in a peripheral region during a process of manufacturing a semiconductor device includes a first bit line contact plug coupled to an active region and a second bit line contact plug coupled to a gate.

BRIEF SUMMARY OF THE INVENTION

Various embodiments of the present invention are directed to providing a semiconductor device and a method for manufacturing the same that substantially obviate one or more problems due to limitations and disadvantages of the related art.

In accordance with one aspect of the present invention, a method of manufacturing a semiconductor device, the method comprising: etching a semiconductor substrate to form a trench; forming a gate material layer in the trench to form a gate within the trench; forming an insulating film over the semiconductor substrate in which the gate is formed; etching the insulating film to form a first bit line contact hole exposing the semiconductor substrate and a second bit line contact hole exposing the gate and; and forming a conductive material in the first bit contact hole and the second bit contact hole so as to form first and second bit line contact plugs, respectively.

The gate is formed in a peripheral region.

Further comprising forming a spacer over an inner sidewall of the trench after the forming of the trench, wherein the spacer is formed of a material including nitride and has a thickness of 200 to 300 Å.

The gate material layer includes a stacked structure of a gate polysilicon layer, a gate metal layer, and a gate hard mask layer.

The gate metal layer includes tungsten silicide and the gate hard mask layer includes nitride.

The second bit line contact hole is formed such that the gate metal layer is exposed.

Further comprising forming a barrier metal layer in the first bit line contact hole and the second bit line contact hole, wherein the barrier metal layer is formed of any one selected from among a titanium film, a titanium nitride film, and a combination thereof.

The conductive material includes tungsten and the insulating film is formed of a material including oxide.

In accordance with one aspect of the present invention, a gate buried in a semiconductor substrate; a first bit line contact plug coupled to the semiconductor substrate; and a second bit line contact plug coupled to the gate.

The gate is formed in a peripheral region.

Further comprising a bit line coupled to the first bit line contact plug and the second bit line contact plug.

The first bit line contact plug, the second bit line contact plug and the bit line are formed of a material including tungsten.

The gate includes a lamination structure of a gate polysilicon layer, a gate metal layer and a gate hard mask layer.

The gate metal layer includes tungsten silicide and the gate hard mask layer includes nitride.

The second bit line contact plug is coupled to the gate metal layer.

Further comprising a spacer formed of a nitride film and formed over a sidewall of the gate.

Further comprising a barrier metal layer formed in the first bit line contact plug and the second bit line contact plug and formed of any of a titanium film, a titanium nitride film and a combination thereof.

In accordance with one aspect of the present invention, A semiconductor device comprising: first and second buried peri-gates formed in a peripheral region of a semiconductor substrate; a first bit line contact plug electrically coupled to the semiconductor substrate at a side of the first buried peri-gate; and a second bit line contact plug electrically coupled to the second buried peri-gate.

The bottom of the first buried peri-gate is located at a second height level and the bottom of the first bit line contact plug is located at a first height level which is higher than the second height level.

The first buried peri-gate includes a stack structure comprising a conductive pattern and a hard mask pattern formed over the conductive pattern, wherein the top of the conductive pattern of the first buried peri-gate is located at a second height level and the bottom of the first bit line contact plug is located at a first height level which is further from the base of the substrate than the second height level.

It is to be understood that both the foregoing general description and the following detailed description of the present invention are exemplary and explanatory and are intended to provide further explanation of the invention as claimed.

DESCRIPTION OF EMBODIMENTS

Hereinafter, a semiconductor device and a method of manufacturing the same will be described with reference to the accompanying drawings.

Figure 1A:
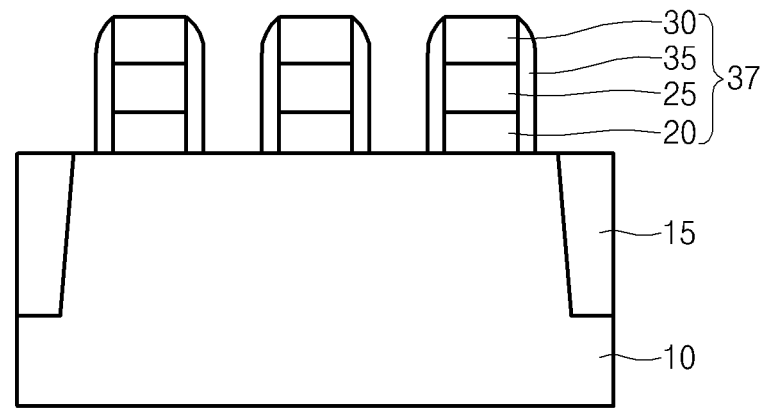
FIGS. 1A and 1B are cross-sectional views showing a method of manufacturing a semiconductor device of the related art.
Figure 1B:
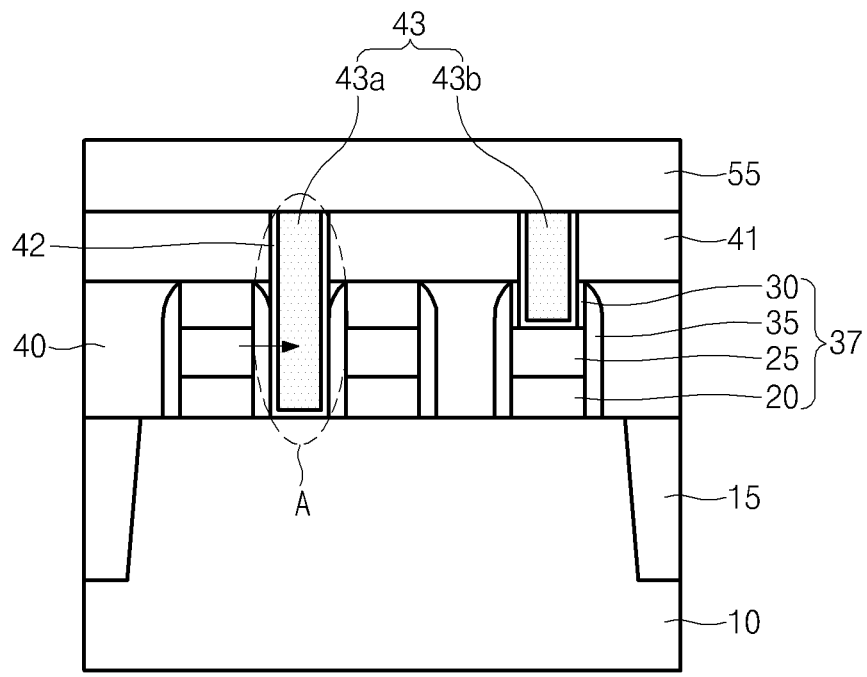

FIGS. 1A and 1B are cross-sectional views showing a conventional method of manufacturing a semiconductor device including a general bit line contact plug. In particular, FIGS. 1A and 1B show a peripheral region of the semiconductor device. Referring to FIG. 1A, a device isolation film 15 defining an active region is formed in a semiconductor substrate 10.

Next, gates 37 are formed on the semiconductor substrate 10. Each gate 37 includes a stacked structure of a gate polysilicon layer 20, a gate metal layer 25 and a gate hard mask layer 30, and includes a spacer 35 deposited on a sidewall of the lamination structure. The gate metal layer 25 may be formed of a tungsten layer and the gate hard mask layer 30 may be formed of a nitride film.

Referring to FIG. 1B, a landing plug contact 40 is formed between the gates 37. Next, an interlayer insulating film 41 is formed on the semiconductor substrate 10 including the gates 37 and the landing plug contact 40.

Next, the interlayer insulating film 41 is etched so as to form a bit line contact hole, and a barrier metal layer 42 is formed on an inner sidewall and a bottom of the bit line contact hole. Then, a tungsten layer is buried in the bit line contact hole, in which the barrier metal layer 42 is deposited, so as to form a bit line contact plug 43. The bit line contact plug 43 includes a first bit line contact plug 43a coupled to the semiconductor substrate 10 and a second bit line contact plug 43b coupled to the gate 37. Next, a bit line 55 coupled to the bit line contact plug 43 is formed over the bit line contact plug 43 and the insulating film 41.

Recently, as the scale of critical dimensions of a semiconductor device are reduced and the gap between the gates 37 narrows, the distance between the bit line contact plug 43 and the gate 37 is decreased. The process of forming the first bit line contact plug 43a coupled to the semiconductor substrate 10 and the process of forming the second bit line contact plug 43b coupled to the gate 37 are simultaneously performed under the same conditions. In an etching process for forming the bit line contact hole, the spacer 35 of the gate 37 may be damaged, resulting in the gate 37 and the bit line contact plug 43 being short-circuited (see "A" of FIG. 1B).

FIGS. 2A to 2E are cross-sectional views showing a method of manufacturing a semiconductor device according to an embodiment of the present invention. In particular, FIGS. 2A to 2E show a peripheral region of the semiconductor device.

Figure 2A:
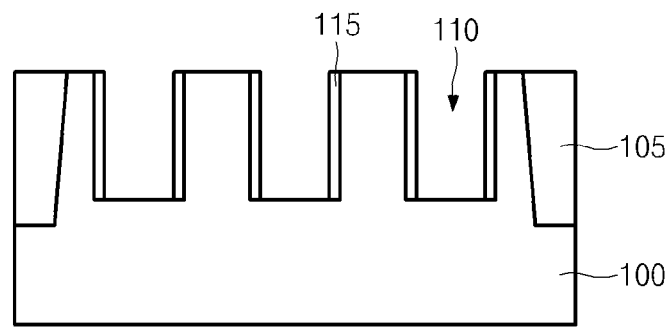
FIGS. 2A to 2E are cross-sectional views showing a method of manufacturing a semiconductor device according to an embodiment of the present invention.

Referring to FIG. 2A, a semiconductor substrate 100 is etched so as to form a device isolation trench. Subsequently, an oxide film is buried in the device isolation trench so as to form a device isolation film 105 defining an active region. Next, the semiconductor substrate 100 of a region, in which a gate will be formed, is etched so as to form a trench 110. Then, a nitride film (not shown) is deposited on the entire surface of the semiconductor substrate 100 including the trench 110 and an etch-back process is performed so as to form a spacer 115 on an inner sidewall of the trench 110.

Figure 2B:
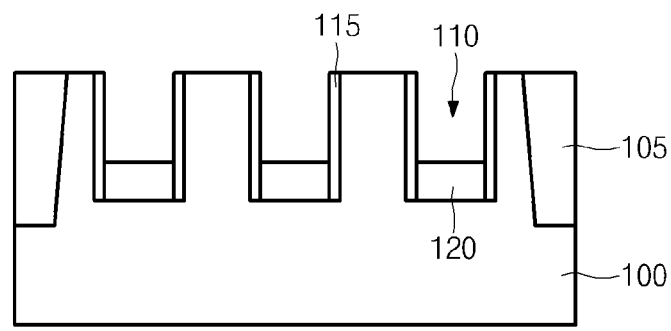

Referring to FIG. 2B, a gate oxide (not shown) and a gate polysilicon layer 120 are formed on the bottom of the trench 110 in which the spacer 115 is formed. The process of forming the gate polysilicon layer 120 on the bottom of the trench 110 will now be described in detail. First, a polysilicon layer is formed on the entire surface of the semiconductor substrate 100 including the trench 110 in which the spacer 115 is formed. The thickness of the polysilicon layer is preferably 10,000 to 14,000 angstroms. Next, the polysilicon layer is etched such that the polysilicon layer is left only on the bottom of the trench 110. The polysilicon etching process is performed using a difference in an etching selection ratio between the semiconductor substrate 10 and an etch stop layer, i.e., the polysilicon layer.

Figure 2C:
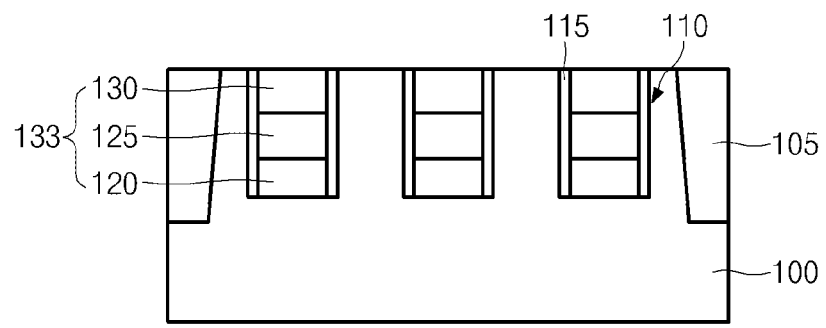

Referring to FIG. 2C, a gate metal layer 125 is formed on the gate polysilicon layer 120 buried in the trench 110. The gate metal layer 125 is preferably formed of a material including tungsten silicide. In a method of forming the gate metal layer 125, a tungsten silicide layer (WSix) is formed on the entire surface of the semiconductor substrate 100 including the trench 110 in which the gate polysilicon layer 120 is formed. The thickness of the tungsten silicide layer is preferably 7,000 to 10,000 angstroms. The gate metal layer 125 is formed on the gate polysilicon layer 120 buried in the trench 110 by wet etching using an etching selection ratio between the tungsten silicide layer and a etch stop layer, i.e., the substrate 100.

Next, a nitride film is formed over the entire surface of the semiconductor substrate 100 including the trench 110 in which the gate metal layer 125 is formed. The thickness of the nitride film is preferably 5,000 to 8,000 angstroms.

Next, wet etching using the etching selection ratio of the nitride film is performed and then a Chemical Mechanical Polishing (CMP) process is performed until the semiconductor substrate 100 is exposed, thereby forming a gate hard mask layer 130. Accordingly, a buried lamination structure including the gate polysilicon layer 120, the gate metal layer 125 and the gate hard mask layer 130 is formed in the trench 110. This lamination structure is thereafter referred to as a gate 133.

Figure 2D:
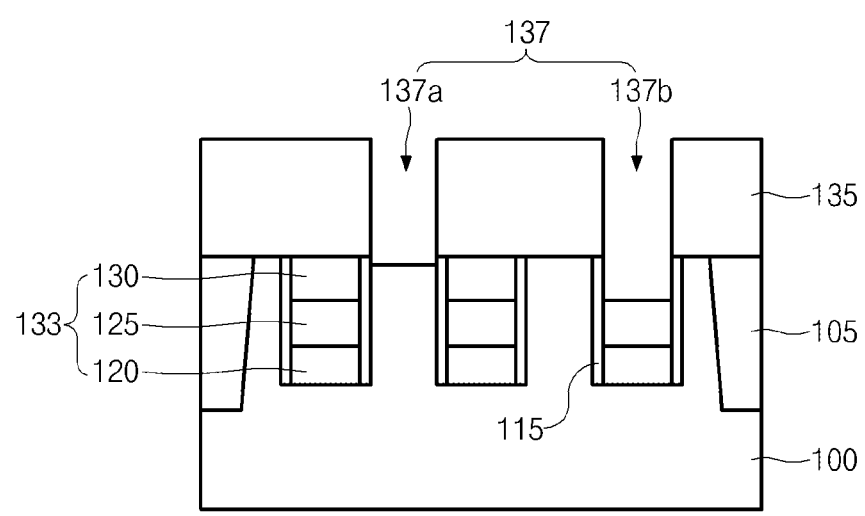

Referring to FIG. 2D, an insulating film 135 is formed on the entire surface of the semiconductor substrate 100 in which the gate 133 is formed. The insulating film 135 is preferably formed of a material including oxide (or oxide material). Next, a mask pattern (not shown) defining a region reserved for a bit line contact hole is formed on the insulating film 135. Then, the insulating film 135 is etched using the mask pattern (not shown) as an etching mask so as to form a bit line contact hole 137. The bit line contact hole 137 includes a first bit line contact hole 137a for exposing an active region on the semiconductor substrate 100, and a second bit line contact hole 137b for exposing the gate 133. It is preferable that the first and second bit line contact holes 137a and 137b are etched under the same etching condition and are simultaneously etched. In detail, it is preferable that the second bit line contact hole 137b is overetched until the gate metal layer 125 of the gate 133 is exposed.

Figure 2E:
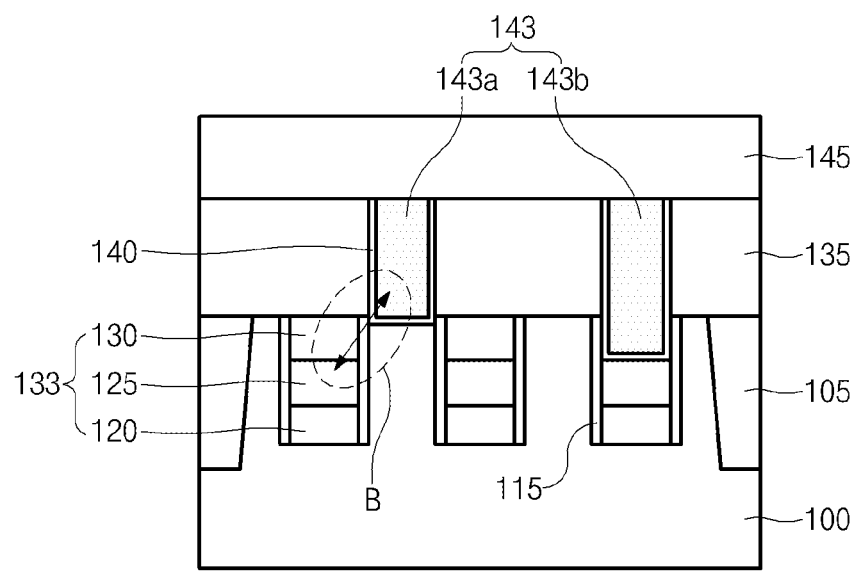

Referring to FIG. 2E, a barrier metal layer 140 is deposited in a lining pattern on the entire surface of the insulating film 135 including the bit line contact hole 137. The barrier metal layer 140 is preferably formed of any of a titanium film, a titanium nitride film, or a combination thereof.

Next, a conductive material is deposited on the entire surface of the insulating film 135 including the bit line contact hole 137 in which the barrier metal layer 140 is formed. Next, the conductive material is planarized and etched until the insulating film 135 is exposed, thereby forming a bit line contact plug 143. The conductive material is preferably formed of a material such as tungsten. Next, a bit line 145 coupled to the bit line contact plug 143 is formed over the bit line contact plug 143 and the insulating film 135.

During the etching process for forming the bit line contact hole 137, loss may occur in the spacer 115 and the gate hard mask layer 130 formed of the nitride film. However, as denoted by "B" of FIG. 2E, the gate 133 is recessed, or buried in the semiconductor substrate 100, and thus bit line contact hole 137 does not need to be formed as deep as the bottom of the gate 133. That is, since the bit line contact hole 137 is formed as deep as the upper surface of the gate 133, the chance that a conductive pattern of the gate 133, i.e., the gate metal layer 125 or the gate polysilicon layer 120, is attacked by the bit line contact hole 137, is significantly reduced. Accordingly, it is possible to prevent an electric short between the gate 133 and the bit line contact plug 143.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A semiconductor device comprising:
   a gate buried in a trench formed in a semiconductor substrate, the gate including a gate metal layer;
   a first bit line contact plug coupled to the semiconductor substrate, wherein an upper surface of the gate metal layer is formed at a lower level than a bottom of the first bit line contact plug; and
   a second bit line contact plug coupled to the gate,
   wherein the gate is formed in a peripheral region.

2. The semiconductor device according to claim 1, the device further comprising a bit line coupled to any of the first bit line contact plug and the second bit line contact plug.

3. The semiconductor device according to claim 2, wherein the first bit line contact plug, the second bit line contact plug, and the bit line each include tungsten.

4. The semiconductor device according to claim 1, wherein the gate includes a laminated structure of a gate polysilicon layer, the gate metal layer, and a gate hard mask layer.

5. The semiconductor device according to claim 4, wherein the gate metal layer includes tungsten silicide and the gate hard mask layer includes nitride.

6. The semiconductor device according to claim 4, wherein the second bit line contact plug is coupled to the gate metal layer.

7. The semiconductor device according to claim 1, the device further comprising a spacer including a nitride film and formed over a sidewall of the gate.

8. The semiconductor device according to claim 1, the device further comprising:
   a first barrier metal layer formed between the first bit line contact plug and the substrate; and
   a second barrier metal layer formed between the second bit line contact plug and the gate,
   wherein any of the first and the second barrier metal layer is formed of any of a titanium film, a titanium nitride film, and a combination thereof.

9. A semiconductor device comprising:
   first and second buried peri-gates formed in a peripheral region of a semiconductor substrate, the first and second peri-gates each including a conductive pattern;
   a first bit line contact plug coupled to the semiconductor substrate at a side of the first buried peri-gate, wherein an upper surface of the conductive pattern of the first buried peri-gate is formed at a lower level than a bottom of the first bit line contact plug; and
   a second bit line contact plug coupled to the second buried peri-gate.

10. The device of claim 9, wherein a bottom of the first buried peri-gate is located at a second height level and a bottom of the first bit line contact plug is located at a first height level which is higher than the second height level.

11. The device of claim 9, wherein the first buried peri-gate includes a stack structure comprising the conductive pattern and a hard mask pattern formed over the conductive pattern.

* * * * *